(12) United States Patent
Hoffmann

(10) Patent No.: US 7,071,729 B2
(45) Date of Patent: Jul. 4, 2006

(54) DUAL-PURPOSE SHIFT REGISTER

(75) Inventor: Jochen Hoffmann, Colchester, VT (US)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/716,381

(22) Filed: Nov. 17, 2003

(65) Prior Publication Data

US 2004/0151276 A1     Aug. 5, 2004

Related U.S. Application Data

(60) Provisional application No. 60/427,207, filed on Nov. 18, 2002.

(51) Int. Cl.
*H03K 19/173*     (2006.01)

(52) U.S. Cl. .......................... 326/38; 326/46; 327/525

(58) Field of Classification Search ............ 326/37–41, 326/46, 82, 83; 327/525
See application file for complete search history.

(56) References Cited

U.S. PATENT DOCUMENTS

| | | | |
|---|---|---|---|
| 5,859,801 A * | 1/1999 | Poechmueller | 365/200 |
| 6,426,911 B1 * | 7/2002 | Lehmann et al. | 365/225.7 |
| 6,798,272 B1 * | 9/2004 | Lehmann | 327/525 |
| 2004/0156226 A1 | 8/2004 | Hoffmann et al. | |

* cited by examiner

*Primary Examiner*—Don Le
(74) *Attorney, Agent, or Firm*—Patterson & Sheridan, L.L.P.

(57) ABSTRACT

A serial shift register and method for simultaneously storing bits of data and a serially advancing pointer is provided. In one embodiment, each stage of the shift register may have only two latches: one to store a bit of pointer information and one to store data.

25 Claims, 9 Drawing Sheets

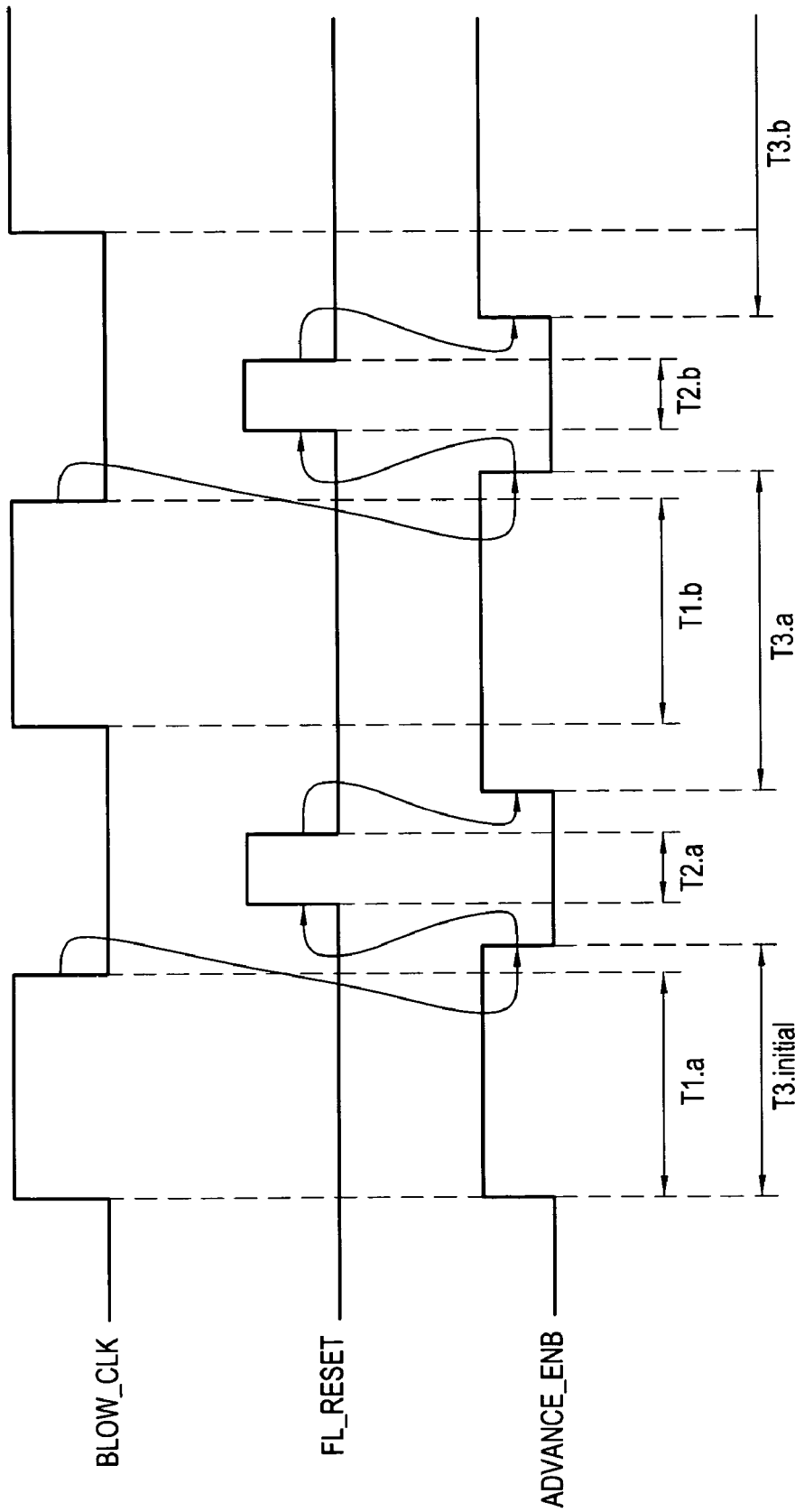

DUAL-PURPOSE SHIFT REGISTER

CROSS-REFERENCE TO RELATED APPLICATIONS

This application claims priority to U.S. provisional patent application Ser. No. 60/427,207, filed Nov. 18, 2002, and is related to the commonly-owned, co-pending U.S. patent application Ser. No. 10/717,178 entitled EXTERNALLY CLOCKED ELECTRICAL FUSE PROGRAMMING WITH ASYNCHRONOUS FUSE SELECTION, filed Nov. 17, 2003, both of which are herein incorporated by reference in their entirety.

BACKGROUND OF THE INVENTION

1. Field of the Invention

The present invention generally relates to integrated circuit (IC) devices, and more particularly to shift registers capable of storing data and a serially advancing pointer.

2. Description of the Related Art

Memory devices, such as dynamic random access memory (DRAM) devices typically include fuse circuits. Fuses included in these fuse circuits may be employed to activate redundant elements which replace failing cells or components. Fuses may be grouped into two classes, for example, laser fuses and electrical fuses. Laser fuses are blown by a chip-external laser beam which irradiates specific fuses to supply enough energy to blow the fuse. Electrical fuses are blown when a current through the fuses exceeds a threshold causing energy build up to blow the fuse.

Electrical fuses typically require a number of support circuits in order to be able to program ("soft-set") and blow ("hard-set") them. In conventional devices, this support circuitry typically includes latch circuits (latches) to store the state of the fuse for use during normal operation of the device (referred to as fuse latches), latches for storing fuse programming information (i.e., whether or not corresponding fuses should be blown), address circuitry allowing each fuse to be selected separately, and blow circuitry to apply a blow-voltage to each selected fuse separately.

The address circuitry typically utilize one of two general types of addressing: direct decoded addressing and addressing by serial shifting. Direct addressing is typically utilized if address-decoders already exist on the device that can be reused to address the fuses (e.g., word line and/or column select line decoders on a DRAM device). If such reuse is not possible, adding new address-decoders just for the fuses is generally not an option as this would be space-prohibitive. If decoded addressing is not an option, a serial shift register can be used to program and blow the fuses.

FIGS. 1A–1C illustrate a fuse programming circuit 100 utilizing a conventional serial shift register 110, at different stages in a conventional fuse programming procedure. As illustrated, three latch circuits are typically used per fuse 150: two latch circuits 122–124 per stage 120 of the shift-register and one fuse latch 126 to hold the actual fuse programming data. The fuse latch 126 is not incorporated into the conventional shift register 110 because, as will be described below, any data stored in the shift register 110 is overwritten when pointer information is transferred through the shift register 110.

For example, as illustrated in FIG. 1A, a string of fuse programming data bits (illustratively "01 . . . 1,") indicating which fuses are to be blown is first shifted into the shift register 110. Once this shifting is complete, the shift register 110 contains the fuse programming data, illustratively, with one bit stored in the second latch 124 of each stage 120. The bit stored in the second latch 124 of each stage will be used to determine whether or not to apply a voltage ($V_{BLOW}$) sufficient to blow a corresponding fuse 150 during a blow period. During the blow period, fuses are typically blown individually, for example, in an effort to reduce the amount of power required of the corresponding blow circuitry.

In order to select the fuses individually, a serially advancing pointer is shifted through the shift register 110. However, in order to prevent this pointer from overwriting the fuse programming data, the contents of the shift register 110 are first copied over to the fuse-latches, as shown in FIG. 1B. As illustrated in FIG. 1C, the pointer (e.g., as shown a "1" in a string of "0"s or vice-versa) is advanced through the shift-register. At each stage of the shift register the blow circuit 140 determines if the fuse 150 has to be blown (e.g., as indicated by a "1" in a corresponding fuse-latch) and whether the pointer reached this stage. If both conditions are met, the blow circuit may apply the blow voltage ($V_{BLOW}$) to the fuse, by closing a switch 142 (e.g., by switching a transistor). For example, as shown in FIG. 1C, the pointer has reached stage 1, which contains a "0" in the fuse latch circuit 126. Therefore, the fuse 150, will not be blown. However, after the pointer is advanced to the next stage, the fuse $150_2$ will be blown because the fuse latch circuit 126 of the second stage contains a "1".

As the dimensions of laser fuses do not typically shrink in line with other circuitry, laser fuses typically occupy a larger percentage of chip-area with advancing technology, even if the actual number of fuses remains unchanged. The ability to shrink laser-fuses are generally limited by the width of the laser, its limited movement-control, and the area over which fuse material is sputtered during fuse blowing. Electrical fuses, on the other hand, are not limited in this respect, since a physical structure (e.g., a metal-contact or a transistor gate) used as a fuse is typically used in other circuitry as well. Therefore, electrical fuses typically scale with other circuitry that is used on the chip. As a result, electrical fuses play an increasing role in higher density memory devices.

While fuse programming circuitry utilizing conventional serial shift registers may be more space efficient than those employing direct address decoding, the three latches required, as well as additional support circuitry for the transfer of data from the shift register to the fuse latches, may still prove space-prohibitive. Accordingly, a need exists for a space efficient shift register.

SUMMARY OF THE INVENTION

Embodiments of the present invention generally provide a shift register capable of storing data and a serially advancing pointer and circuit configurations utilizing the same.

One embodiment provides a shift register circuit. The shift register circuit generally includes a data input, a plurality of stages, each comprising a data latch circuit for storing a bit of data, a pointer latch circuit for storing a bit of pointer information, transfer circuitry for serially transferring bits of data presented at the data input and to be stored in the data latch circuits through the plurality of stages during a first mode of operation, and pointer advance circuitry for serially transferring one or more bits of pointer information forming a pointer through the plurality of stages during a second mode of operation without disturbing bits of data stored in the data latch circuits.

Another embodiment provides a fuse programming circuit for sequentially programming a plurality of fuses generally including a shift register and one or more blow circuits. The shift register generally includes a plurality of fuse latch circuits for holding fuse programming data indicating which of the fuses are to be blown, a plurality of pointer latch circuits for holding bits of a pointer for selecting one of the fuses, and pointer advance circuitry for serially advancing the pointer to select different fuses without disturbing bits of data stored in the data latch circuits. The one or more blow circuits configured to apply a blow voltage to a fuse selected by pointer if the fuse programming data stored in a corresponding fuse latch circuit indicates the selected fuse is to be blown.

Another embodiment provides a method for maintaining both pointer and data information in a shift register having multiple stages, each stage having a pointer latch circuit and a fuse latch circuit. The method generally includes shifting data bits into the data latch circuits through the pointer latch circuits, decoupling the data latch circuits and pointer latch circuits, initializing a pointer formed by bits stored in the pointer latch circuits to select a first stage of the shift register, and serially advancing the pointer to select a second stage of the shift register by changing one or more bits stored in the pointer latch circuits without disturbing the data bits in the data latch circuits.

Another embodiment provides a method for sequentially programming a plurality of fuses. The method generally includes (a) loading a shift register having a plurality of stages with fuse programming data, wherein each stage of the shift register comprises a pointer latch circuit and a data latch circuit and each data latch circuit stored a bit of fuse programming data to indicate whether an associated one of the fuses is to be blown, (b) initializing a fuse pointer, formed by bits stored in the pointer latch circuits, to select a fuse, (c) blowing the fuse selected by the fuse pointer if the bit of fuse programming data stored in the associated data latch circuit indicates the fuse is to be blown, (d) advancing the pointer to select a subsequent fuse, and (e) repeating steps (c)–(d) until each of the fuses has been selected.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

FIG. 3C illustrates an exemplary timing diagram corresponding to the schematic diagram of FIG. 3B.

DETAILED DESCRIPTION OF THE PREFERRED EMBODIMENTS

Embodiments of the present invention provide a shift register capable of maintaining a plurality of data bits and a plurality of bits indicative of a serially advancing pointer. Because the pointer is allowed to advance without interfering with the data bits, data and pointer bits may be stored in each stage with only two latch circuits. As a result, the number of latches required per stage for various circuits requiring pointer and data bits, such as fuse programming circuits, may be reduced relative to such circuits utilizing conventional shift registers, which require an additional (third) latch per stage and additional circuitry for storing the data bits which would be overwritten by the pointer. As a result, circuits utilizing the shift register described herein may occupy substantially less area than similar circuits utilizing conventional shift registers, allowing for a more compact layout.

The shift register described herein may be used to advantage for a number of different type applications, and in a number of different integrated circuit devices. However, to facilitate understanding, certain embodiments are described below with reference to circuit configurations utilizing a shift register for fuse blowing and fuse readout. It should be understood that fuse blowing and fuse readout are merely illustrative, and not limiting, examples of applications that may utilize the shift register described herein.

An Exemplary Shift Register

Figure 2A:
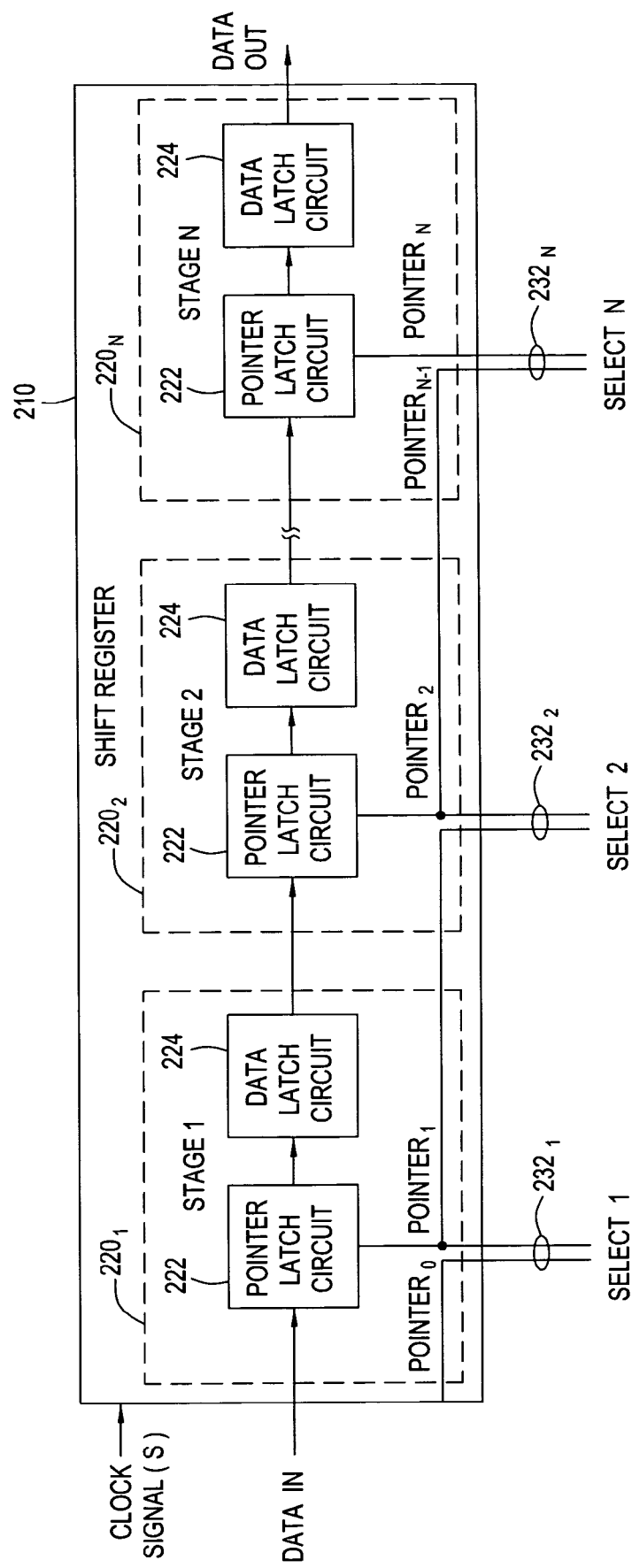
FIGS. 2A and 2B illustrate a block diagram and a schematic diagram, respectively, of a shift register according to one embodiment of the present invention.

FIG. 2A illustrates a shift register 210 in accordance with one embodiment of the present invention. As illustrated, the shift register comprises N stages 220 ($220_1$–$220_N$), each having a pointer latch circuit 222 and a data latch circuit 223. The shift register 210 is configured to concurrently store bits of data in the data latch circuits 224 and bits of pointer information in the pointer latch circuits 224. For example, data presented at a data input (DATA_IN) may be shifted through the pointer latch circuits 222 into the data latch circuits 224, concurrent with clock signals, as with a conventional latch circuit.

The pointer latch circuits 222 and data latch circuits 224 may then be decoupled and the pointer latch circuits 222 may be initialized to provide pointer information to "select" an initial stage (e.g., $220_1$) of the shift register 210 without interfering (e.g., overwriting) data bits stored in the data latch circuits. In other words, a pointer used to select one of the stages 220 may be formed by the bits of pointer information stored in the pointer latch circuits 224. As illustrated, pointer information stored from one or more previous stages may be combined with pointer information from a current stage to select the current stage.

For example, a single bit of a first logic level (surrounded by bits of a second logic level) may be shifted through the pointer latch circuits 222 to select the stages. As will be described in greater detail, a stage $220_i$ may be considered to be selected when the logic level of a bit stored in a pointer latch circuit 222 of a previous stage ($200_{i-1}$) is of the first logic level and a bit stored in its pointer latch circuit 222 is of the second logic level. By providing transfer paths between pointer latch circuits 222, the pointer bits may be transferred (advancing the pointer) without disturbing the data bits stored in the data latch circuits 224, thus eliminating the need to transfer the data bits to external latch circuits.

Figure 2B:
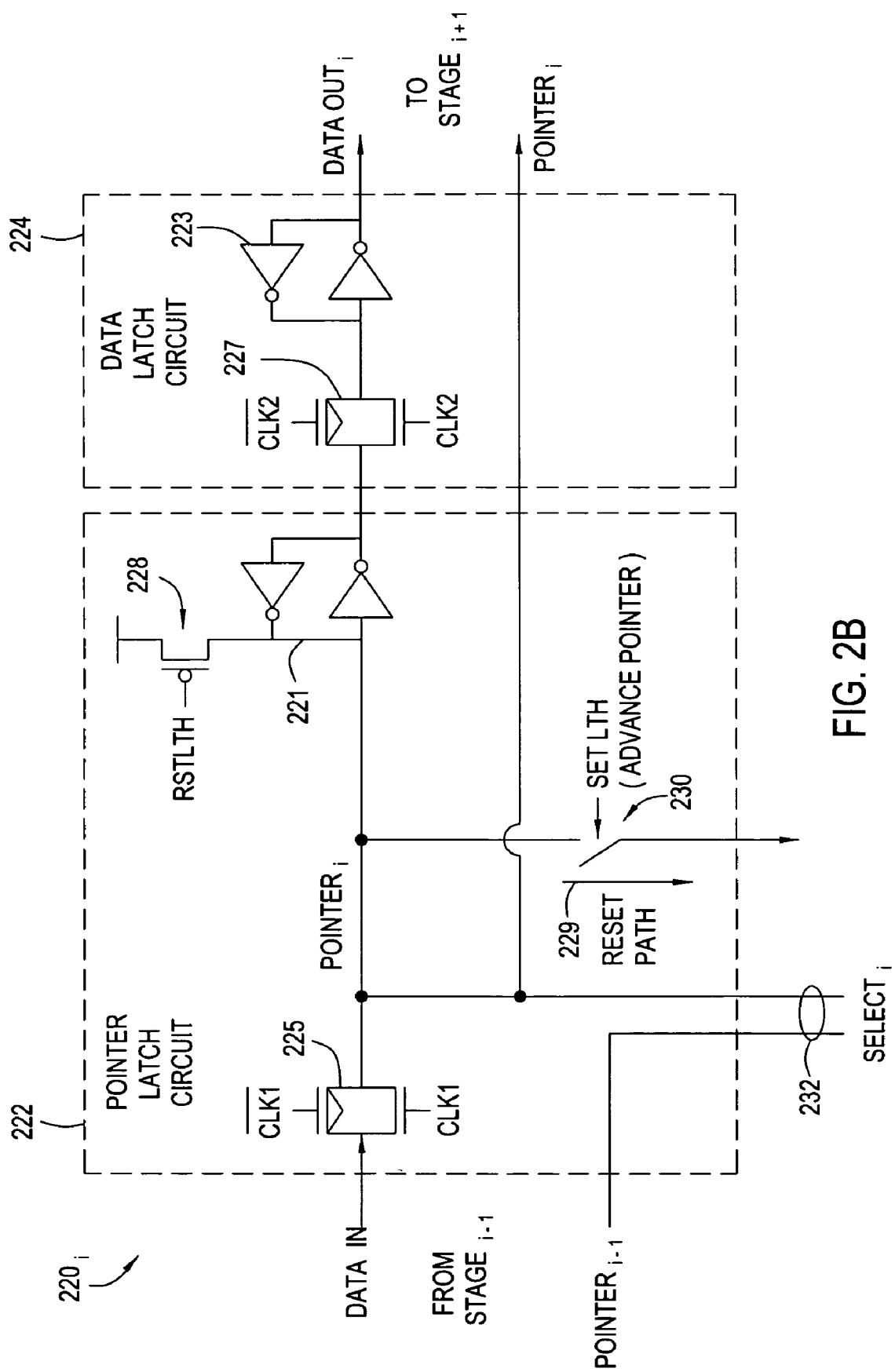

FIG. 2B is a schematic diagram of an exemplary circuit configuration of a single stage $220i$ of the shift register 210.

As illustrated, the pointer latch circuit 222 may include transfer gate 225 and a latch 221 formed by a pair of cross coupled inverters. Similarly, the pointer latch circuit 224 may include transfer gate 227 and a latch 224 formed by a pair of cross coupled inverters. The transfer gates 225 and 227 may be controlled by clock signals CLK1 and CLK2, respectively. Operating CLK1 and CLK2 in a non-overlapping manner, allows data to be shifted through the shift register, with inverted data stored in the pointer latch circuit 222 and data latch circuit 224, as with a conventional shift register.

However, once the data is shifted in (and stored in the data latch circuit 224), the pointer latch circuit 222 and data latch circuit 224 may be decoupled, for example, by holding CLK1 and CLK2 low. Pointer information may then be initialized by resetting (illustratively storing a logic "1") the latch 221 via a pull-up transistor 228, responsive to a reset signal (RstLth). The reset signal may be applied globally to initialize the bit stored in each pointer latch circuit to a logic "1". As previously described, a logic "0" may then be shifted through the pointer latch circuits to sequentially select each stage.

In other words, the stage $220_i$ may be considered to be selected when the pointer latch circuit 222 of a previous stage $220_{i-1}$ contains a logic "0" while its pointer latch circuit 222 contains a logic "1." Accordingly, the pointer may be advanced to select a subsequent stage ($220_{i+1}$) by setting (e.g., to a logic "0") the pointer latch circuit 222 of the current stage $220_i$. As illustrated, the pointer latch circuit 222 may be set by providing a switched path 229 between the input node of the latch 221 and ground.

As will be described below with reference to FIGS. 3A–3C and FIG. 4, the reset path 229 may be provided by closing a switch 230, which may be controlled by various signals, for example, indicating one or more operations involving the stage $220_i$ (e.g., fuse blowing or readout) are complete and/or unnecessary. For some embodiments, the pointer may be advanced synchronously, for example, advancing only a single stage during a clock defined pointer advance cycle. For other embodiments, the pointer may be advanced asynchronously, for example, continuing to advance until a stage is reached that has a data latch circuit 224 storing a bit of data having of a specified logic level. In other words, stages having data latch circuits 224 storing bits that are not of the specified level may be skipped, allowing the pointer to rapidly advance which may advantageously speed certain operations, such as sequential fuse blowing.

Exemplary Fuse Programming Circuit

Figure 1A:
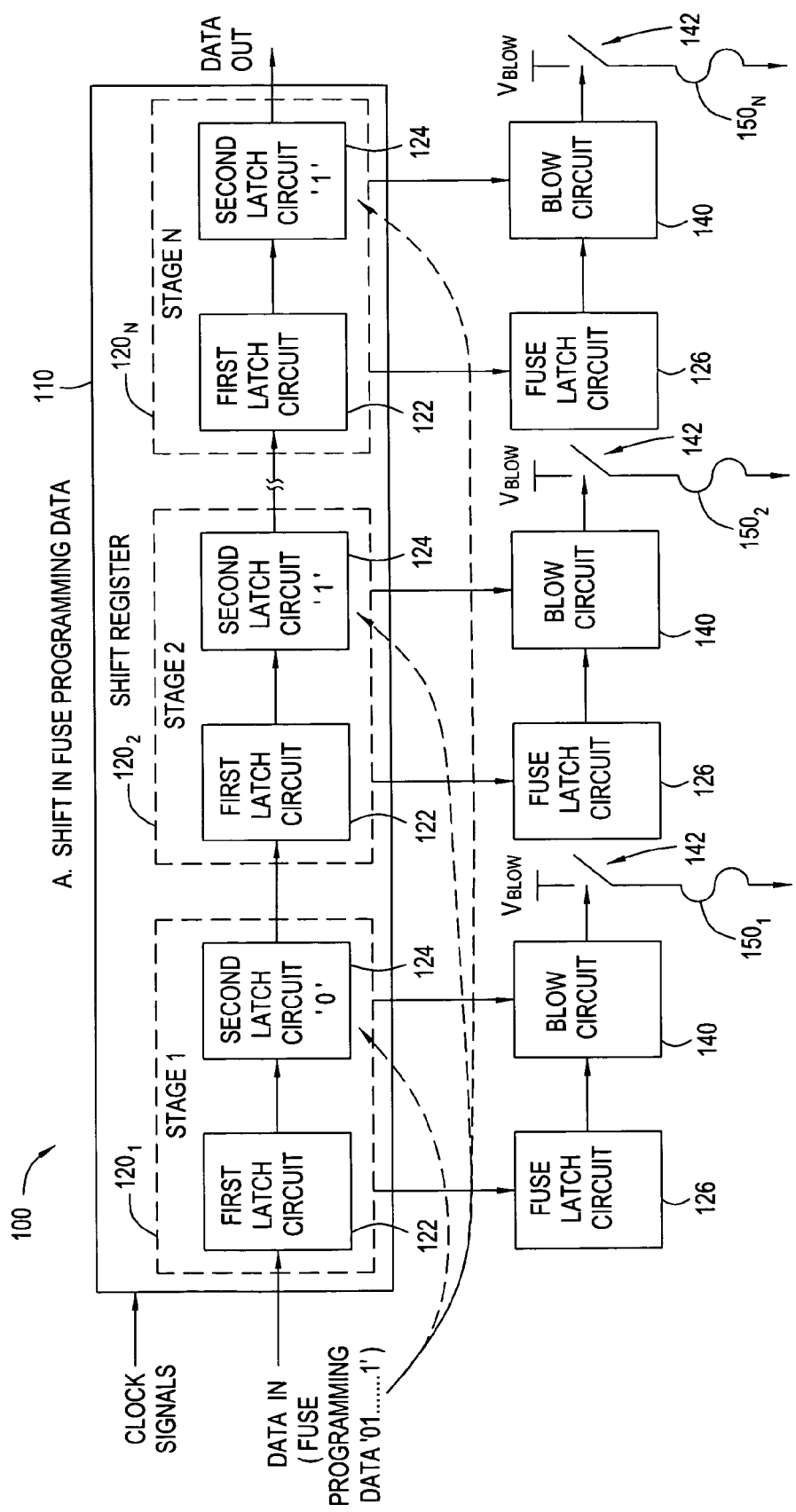
FIGS. 1A–1C illustrate a fuse programming circuit utilizing a shift register in accordance with the prior art.
Figure 1B:
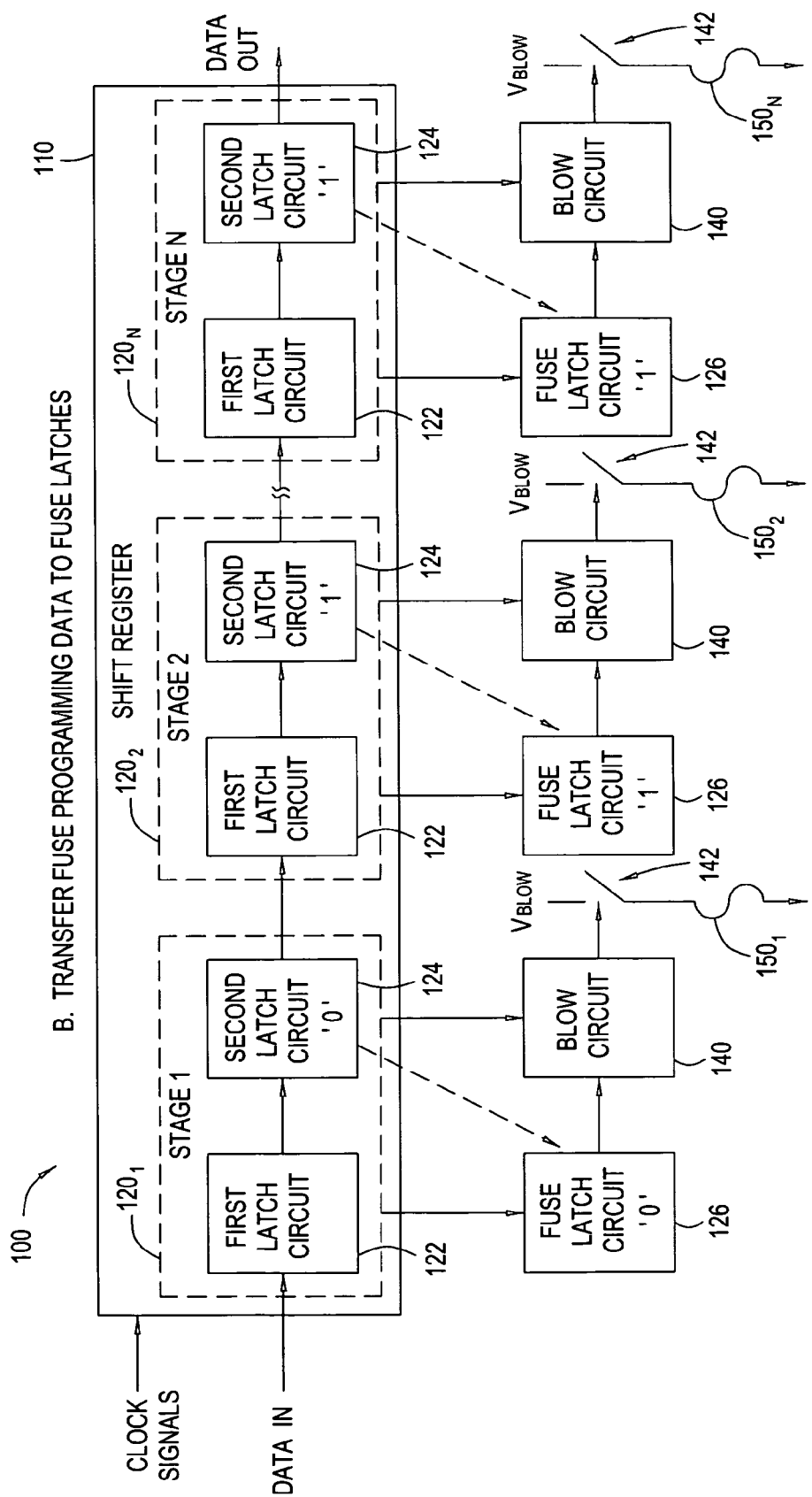
Figure 1C:
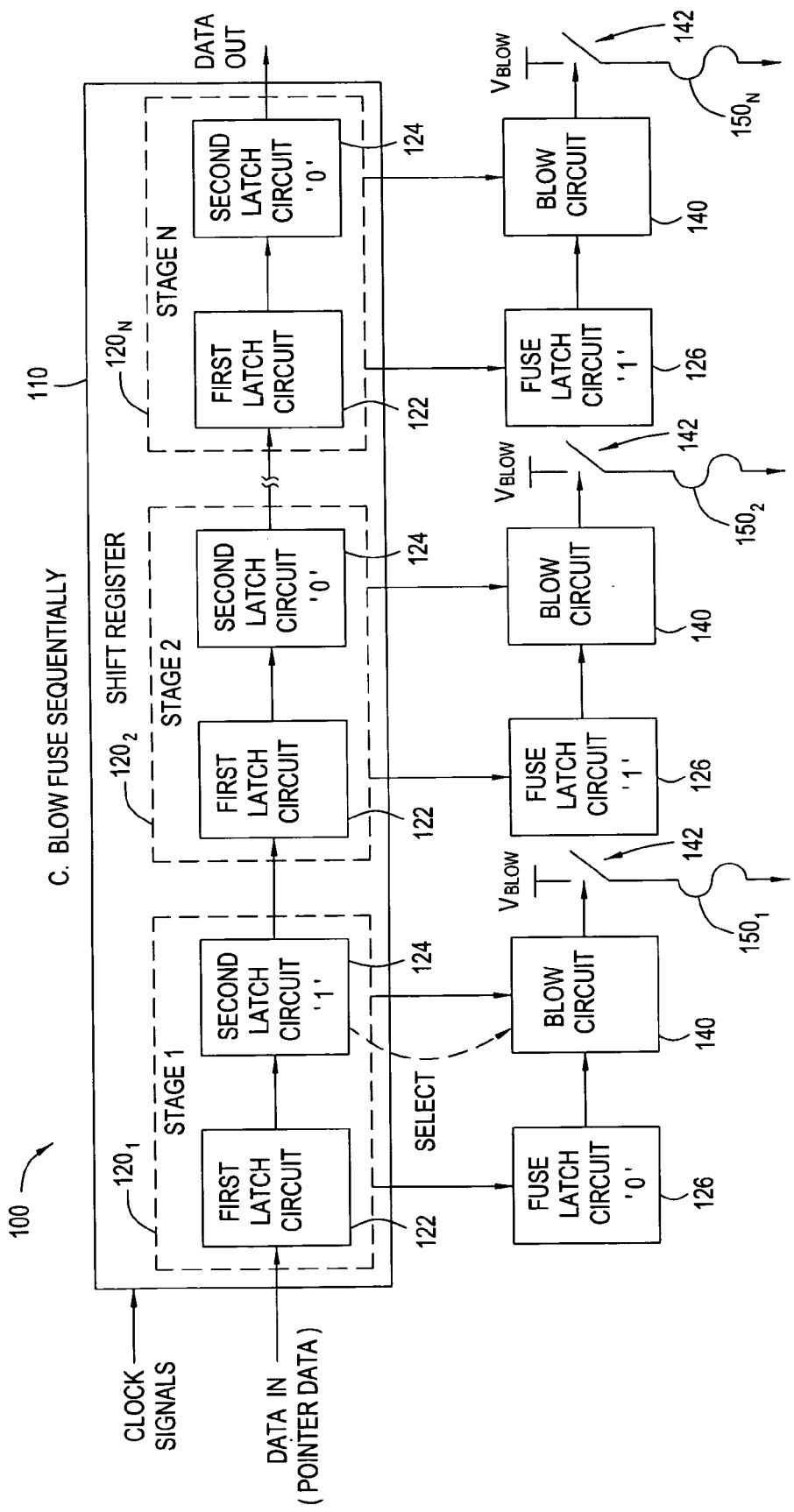
Figure 3A:
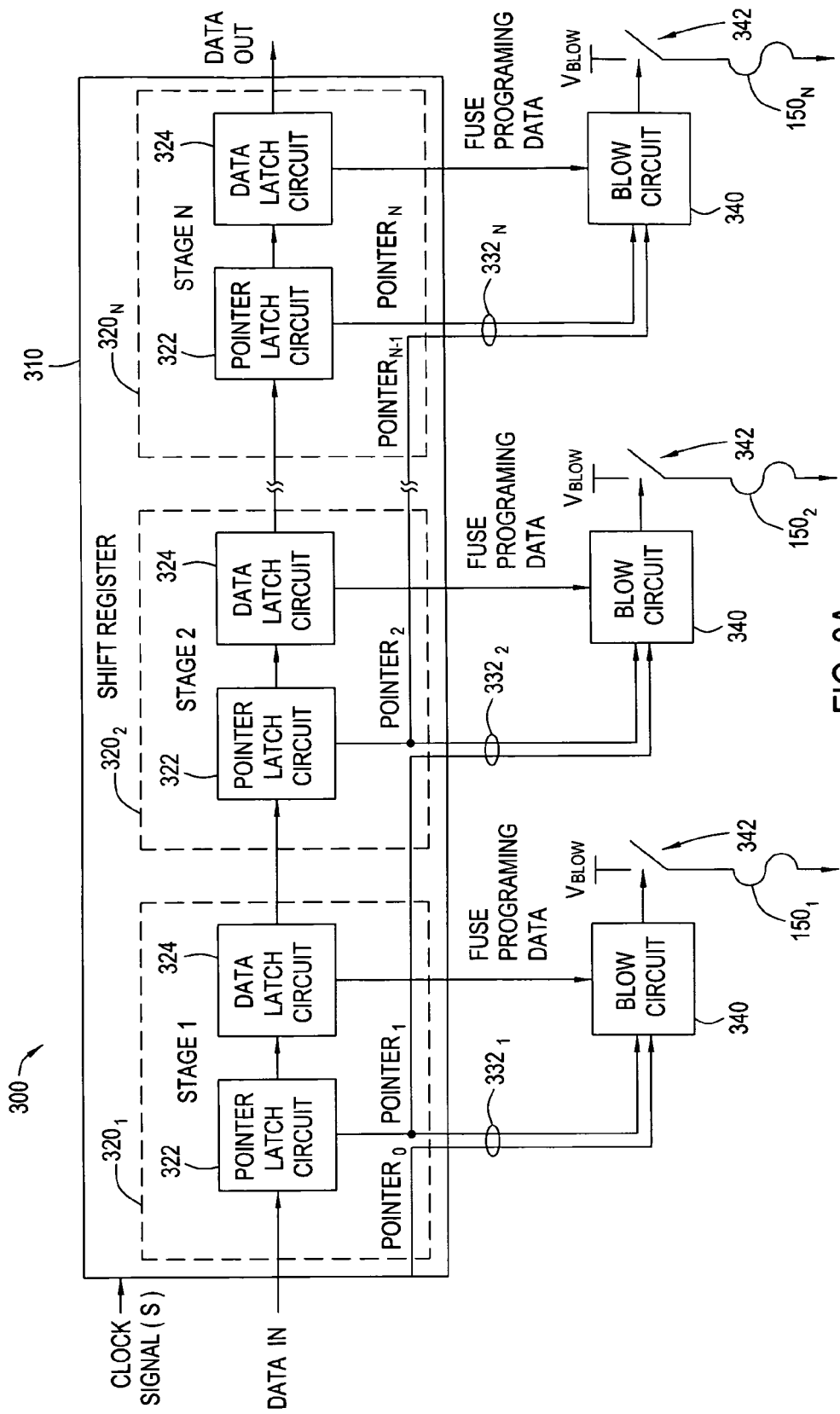
FIGS. 3A and 3B illustrate a block diagram and schematic diagram, respectively, of a fuse programming circuit utilizing a shift register in accordance with one embodiment of the present invention.

FIG. 3A illustrates an exemplary fuse programming circuit 300 that illustrates one potential use of a shift register 310 in accordance with one embodiment of the present invention. For some embodiments, components of the fuse programming circuit 300 may operate in a similar manner to those described in the commonly assigned co-pending application entitled "Externally Clocked Electrical Fuse Programming With Asynchronous Fuse Selection," filed herewith (Atty. Docket No. 2002P12742) and herein incorporated by reference in its entirety. The fuse programming circuit 300 may include a blow circuit 340 coupled with each stage 320 of the shift register 310. By comparing the fuse programming circuit 300 of FIG. 3A with the fuse programming circuit of FIG. 1A, it can be seen that, because the shift register 310 is capable of storing a serially advancing pointer and fuse data, the fuse latch circuit (126) is incorporated into the shift register 310.

Fuse programming data may be shifted into data latch circuits 322 of the shift register 310 and pointer latch circuits 324 may be initialized, as described above. As illustrated, each blow circuit 340 may receive, as input, pointer information 332 indicating whether or not a corresponding stage 320 is selected. If the pointer information 332 indicates the corresponding stage 320 is selected and the bit stored in the data latch circuit 324 indicates the corresponding fuse 150 should be blown, blow circuit 340 blows the fuse 150 by applying a blow voltage $V_{BLOW}$ to the fuse 150, for example, via a switch 342.

After a fuse 150 is blown, the corresponding data latch circuit 324 may be reset and the pointer may be advanced to the next stage. Accordingly, for some embodiments, a fuse programming sequence may be thought of as comprising three distinct modes: a blow mode, a fuse latch reset mode, and a pointer advance mode. As will be described in further detail below, these fuse programming modes may be defined by one or more clock signals input to the shift register 310.

Figure 3B:
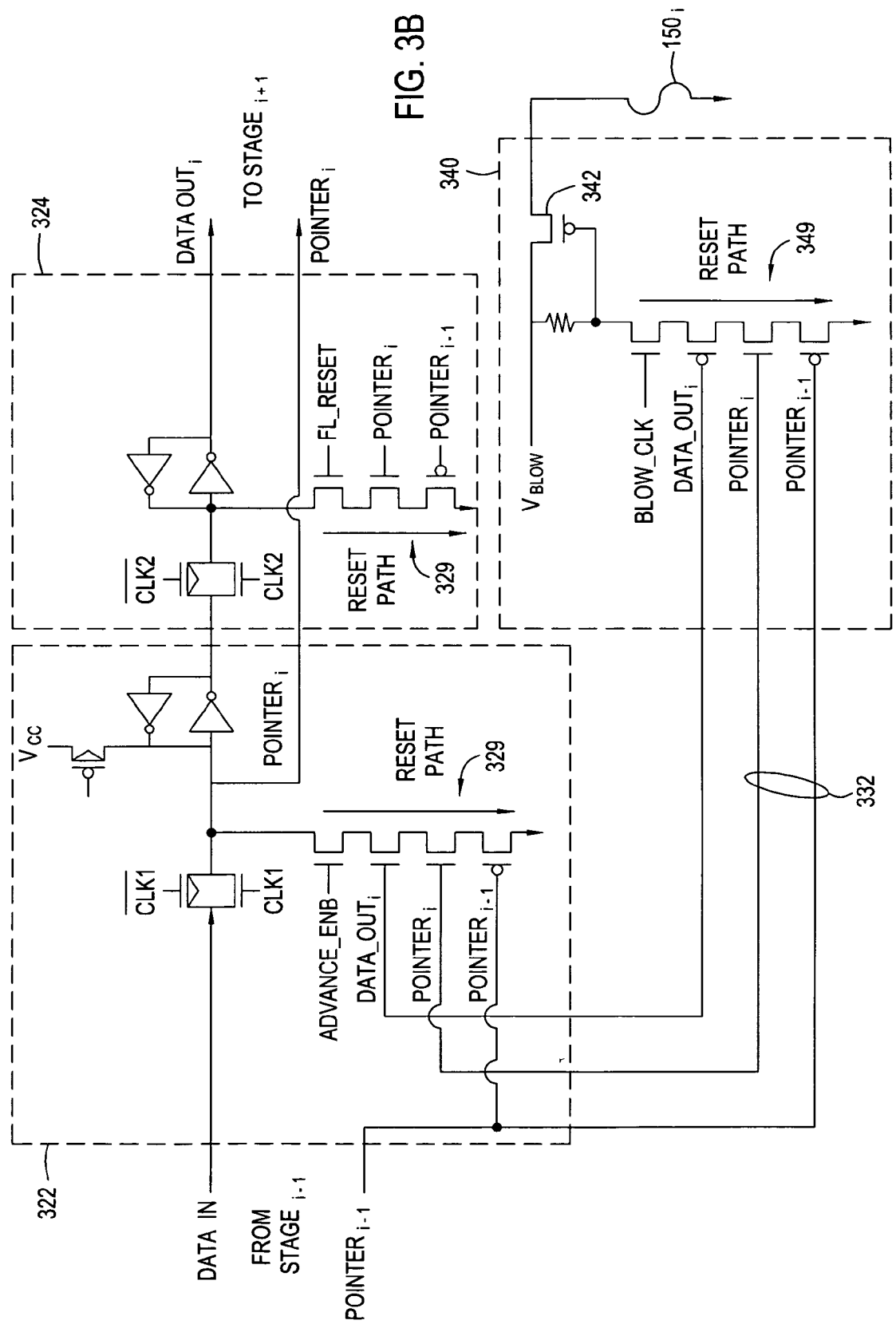

FIG. 3B illustrates an exemplary schematic diagram of one stage $320_i$ of the fuse programming circuit 300 according to one embodiment of the present invention. A programming sequence involving the stage $320_i$ may be described with reference to FIG. 3C which illustrates a timing diagram of clock signals (BLOW_CLK, FL_RESET, and ADVANCE_ENB) utilized by the fuse programming circuit 300. As illustrated in FIG. 3C, the clock signals may define the fuse programming modes. The clock signals may be provided to the fuse programming circuit 300 as separate clock signals or may be derived from a single clock signal.

For purposes of discussion, it may be assumed that the fuse latch circuits 324 have already been loaded with fuse programming data and that the fuse pointer circuits 322 have already been initialized (e.g., all set to "1"). A blow mode will first be described with reference to the fuse blow circuit 340. As illustrated, a switched reset path 349 may be provided between a gate of a P-channel field effect transistor (PFET) 342 used to apply the blow voltage to the fuse $150_i$. In other words, pulling the gate of the transistor 342 low, via the reset path 349, will result in application of $V_{BLOW}$ to the fuse $150_i$.

As illustrated, the reset path 349 includes serially connected transistors receiving as input, the blow clock signal (BLOW_CLK), the state of the bit stored in the fuse latch circuit 324 (DATA_OUT$_i$), and the pointer information 332. In the illustrated configuration, the reset path is closed if BLOW_CLK is asserted, the bit in the fuse latch circuit 332 indicates the fuse $150_i$ is to be blown, and the current stage is selected (e.g., POINTER$_i$=1 and POINTER$_{i-1}$=0). Thus, when all these conditions are met, the transistor 342 will be switched, applying $V_{BLOW}$ to the fuse $150_i$. $V_{BLOW}$ may be applied to the fuse $150_i$ for the remainder of the blow mode T1 (as long as BLOW_CLK is asserted).

In some cases, it may be desirable to reset the bit in the fuse latch circuit 324 to indicate the fuse has already been blown, for example, to prevent re-application of $V_{BLOW}$ to the fuse and/or to allow advancement of the pointer, as described below. Therefore, as shown in FIG. 3C, the blow mode may be followed by a fuse latch reset mode (T2), defined by the assertion of FL_RESET. The bit of the fuse latch circuit 324 may be reset by pulling an input node of the fuse latch low via a switched reset path 329 during a fuse latch reset mode (illustratively, FL_RESET=1), when the current stage $320_i$ is selected (e.g., POINTER$_i$=1 and POINTER$_{i-1}$=0).

The fuse latch reset mode may be followed by a pointer advance mode (ADVANCE_ENB=1). Referring now to the pointer latch circuit 322, it can be seen that, for some embodiments, the fuse latch circuit 322 must be reset (DATA_OUT$_i$=1) in order to advance the fuse pointer to select the next stage. Recall that the pointer may be advanced to select the next stage ($320_{i+1}$) by resetting the pointer latch circuit 322 of the current stage $320_i$. This may be accomplished by providing a switched reset path 329 including serially connected transistors receiving as input, the pointer advance clock signal (ADVANCE_ENB), and the pointer information 332. By also including a PFET controlled by DATA_OUT$_i$ (an inversion of the bit stored in the fuse latch circuit 324) in the switched reset path 329, the pointer may be advanced only when the bit in the fuse pointer latch is "0".

This may be advantageous, for example, for asynchronous operation, allowing the fuse pointer to advance past multiple stages with fuses that do not need to be programmed (within a single pointer advance mode), while automatically stopping to select stages with fuses that do need to be programmed. As previously described, skipping blow cycles for fuses that do not need to be programmed (i.e., $V_{BLOW}$ will not be applied to those fuses anyway), total fuse programming time may be reduced dramatically. As previously described, however, for other embodiments, the fuse pointer may be advance synchronously (e.g., by only one stage per pointer advance mode). In any case, by utilizing the shift register 310 incorporating the fuse data latch circuits 324, the fuse programming circuit 300 may be more compact than, for example, the fuse programming circuit 100 of FIG. 1A, utilizing a conventional shift register 110 requiring additional fuse latch circuits 126.

Exemplary Fuse Readout Circuit

Figure 4:
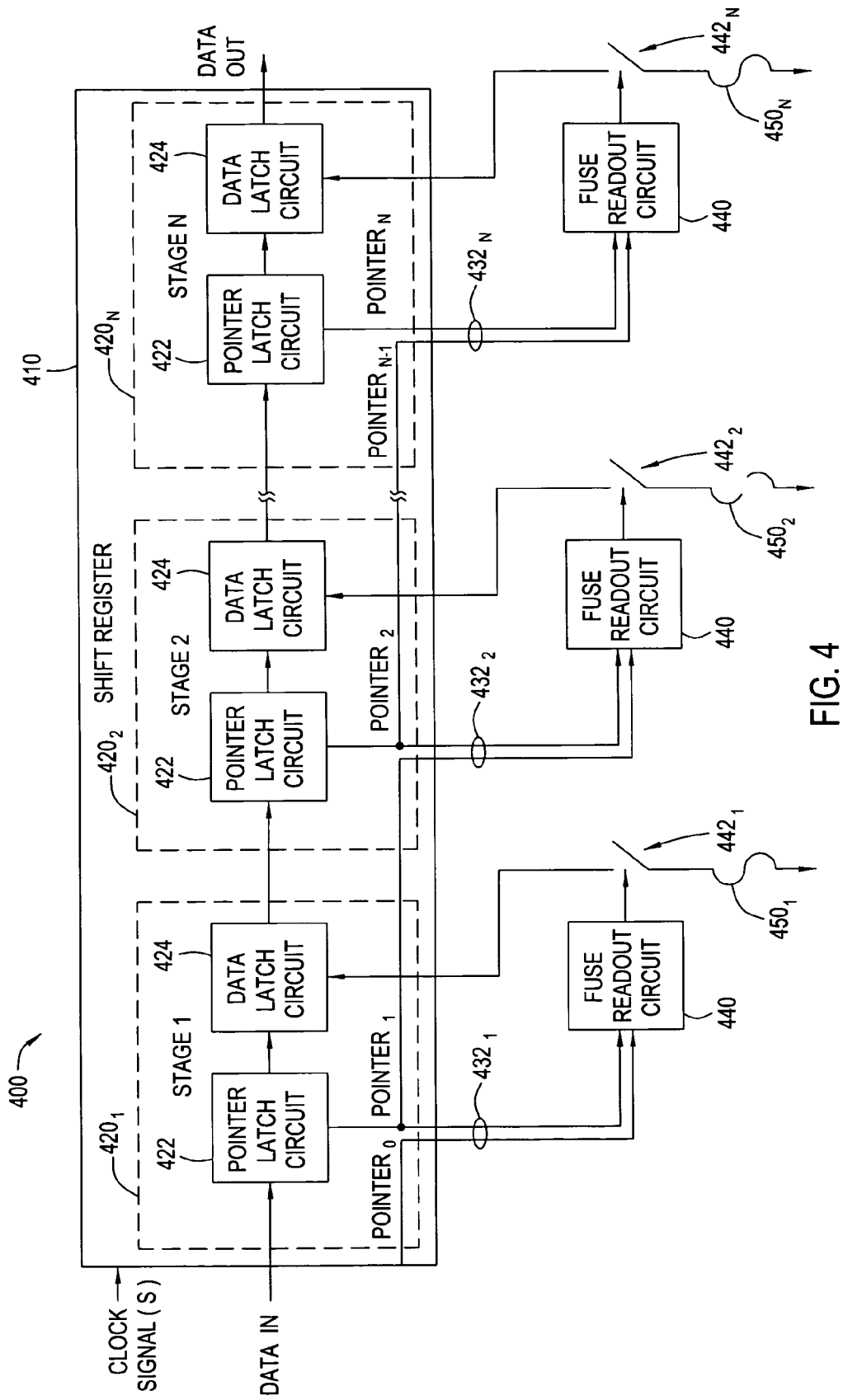
FIG. 4 illustrates an exemplary fuse readout circuit in accordance with one embodiment of the present invention.

As illustrated in FIG. 4, a shift register 410 capable of maintaining data bits and a serially advancing pointer may also be used to advantage in a fuse readout circuit configuration 400. Rather than shift fuse programming data into the shift register 410, the state of fuses 450 may be sequentially read. As previously described, the bits of data in each of the pointer latch circuits 422 may comprise a pointer used to select fuses to be read. The pointer may be advanced without affecting previously read fuse data stored in the data latch circuits 424, for example, by decoupling the pointer latch circuits 422 and data latch circuits 424.

As illustrated, fuse readout circuits 440 responsive to pointer information 432 may be provided for each stage 420. In other words, if a current stage 420 is selected (as indicated by the pointer information 432), the corresponding fuse readout circuit 440 may close a switch 452 allowing the state of the corresponding fuse 450 to be latched in the corresponding data latch circuit 424. As an example, when the first stage $420_1$, is selected, the corresponding fuse readout circuit 440 may close the switch $442_1$, providing a reset path through the fuse 450, shown intact, thereby resetting the corresponding data latch circuit 424. On the other hand, when the second stage $420_2$ is selected and the fuse readout circuit 440 closes the switch $442_2$, no such reset path is provided through the fuse $450_2$ shown blown, thereby preventing reset of the corresponding data latch circuit 424 (which may be preset to a "1"). Once the state of each of the fuses has been readout the pointer latch circuits 422 and data latch circuits 424 may be coupled, allowing the data to be shifted out by operating the shift register 410 in a conventional manner.

Those skilled in the art will recognize that circuitry described with reference to FIG. 4 may also be combined with the fuse programming circuit 300 described with reference to FIGS. 3A-3C to utilize a shift register in accordance with embodiments of the present invention for use in both fuse programming and fuse readout operations.

While the foregoing is directed to embodiments of the present invention, other and further embodiments of the invention may be devised without departing from the basic scope thereof, and the scope thereof is determined by the claims that follow.

What is claimed is:

1. A shift register circuit, comprising:
   a data input;
   a plurality of stages, each comprising a data latch circuit for storing a bit of data, a pointer latch circuit for storing a bit of pointer information;
   transfer circuitry for serially transferring bits of data presented at the data input and to be stored in the data latch circuits through the plurality of stages during a first mode of operation; and
   pointer advance circuitry for serially transferring one or more bits of pointer information forming a pointer through the plurality of stages during a second mode of operation without disturbing bits of data stored in the data latch circuits.

2. The shift register circuit of claim 1, wherein the pointer indicates a stage having a pointer latch circuit storing a bit of a different logic level than a bit stored in a pointer latch circuit of a preceding stage.

3. The shift register circuit of claim 1, wherein the pointer advance circuitry comprises, for each stage, a switched reset path between a first node of a pointer latch circuit and ground.

4. The shift register circuit of claim 3, wherein the pointer advance circuitry is configured to advance a bit of pointer information from a first stage to a subsequent stage by closing the reset path.

5. The shift register circuit of claim 4, wherein the switched reset path comprises at least two serially connected transistors, each responsive to a bit of pointer information stored in a pointer latch circuit of a different stage.

6. The shift register circuit of claim 1, further comprising circuitry for presetting the bit of pointer information stored in each pointer latch circuit.

7. The shift register circuit of claim 1, wherein the pointer advance circuitry is configured to asynchronously advance the pointer.

8. The shift register circuit of claim 1, wherein the transfer circuitry comprises first transfer switches coupled between fuse latch circuits and data latch circuits of adjacent stages and second transfer switches coupled between fuse latch circuits and data latch circuits of the same stage, wherein the first transfer circuits are responsive to a first clock signal and the second transfer circuits are responsive to a second clock signal.

9. The shift register of claim 8, wherein the first and second clock signals are operating in a complementary manner during the first mode of operation and held at the same logic level during the second mode of operation.

10. A fuse programming circuit for sequentially programming a plurality of fuses, comprising:
    a shift register having:
      a data input;
      a plurality of stages, each comprising a fuse latch circuits for holding fuse programming data indicating which of the fuses are to be blown, and a pointer latch circuit for holding bits of a pointer for selecting one of the fuses;

transfer circuitry for serially transferring bits of data presented at the data input and to be stored in the fuse latch circuits through the plurality of stages during a first mode of operation; and a pointer advance circuitry for serially advancing the pointer to select different fuses without disturbing bits of data stored in the fuse latch circuits in a second mode; and one or more blow circuits configured to apply a blow voltage to a fuse selected by the pointer if the fuse programming data stored in a corresponding fuse latch circuit indicates the selected fuse is to be blown.

11. The fuse programming circuit of claim 10, wherein the one or more blow circuits are configured to apply the blow voltage to a fuse selected by pointer if the fuse programming data stored in a corresponding fuse latch circuit indicates the selected fuse is to be blown synchronized with a blow clock signal.

12. The fuse programming circuit of claim 10, wherein the pointer selects a fuse when a pointer latch circuit associated with the fuse contains a bit of a first logic level and a fuse pointer latch associated with a previously selected fuse contains a bit of a second complementary logic level.

13. The fuse programming circuit of claim 10, wherein the pointer advance circuitry is configured to advance the pointer only when a pointer advance signal is asserted.

14. The fuse programming circuit of claim 10, wherein the pointer advance circuitry is configured to advance the pointer only when a bit in a fuse latch circuit corresponding to a currently selected fuse is at a predetermined logic level.

15. The fuse programming circuit of claim 10, further comprising fuse latch reset circuitry configured to place the bit in the fuse latch circuit corresponding to the currently selected fuse to the predetermined logic level after the selected fuse has been programmed.

16. A method for maintaining both pointer and data information in a shift register having multiple stages, each stage having a pointer latch circuit and a fuse latch circuit, the method comprising:

shifting data bits into the data latch circuits through the pointer latch circuits;

decoupling the data latch circuits and pointer latch circuits;

initializing a pointer formed by bits stored in the pointer latch circuits to select a first stage of the shift register; and serially advancing the pointer to select a second stage of the shift register by changing one or more bits stored in the pointer latch circuits without disturbing the data bits in the data latch circuits.

17. The method of claim 16, wherein:

initializing the pointer comprises storing a bit of a first logic level in a first pointer latch circuit and storing bits of a second logic level in the other pointer latch circuits; and serially advancing the pointer comprises shifting the bit of the first logic level from the first pointer latch circuit to a second pointer latch circuit.

18. The method of claim 17, wherein serially advancing the pointer comprises providing a reset path between a node of the first pointer latch circuit and ground.

19. The method of claim 16, wherein serially advancing the pointer comprises asynchronously advancing the pointer.

20. The method of claim 19, wherein asynchronously advancing the pointer comprises advancing the pointer during a pointer advance mode defined by a clock signal until a stage having a data latch circuit storing a bit of a first logic level is selected.

21. A method for sequentially programming a plurality of fuses, comprising:

(a) loading a shift register having a plurality of stages with fuse programming data, wherein each stage of the shift register comprises a pointer latch circuit and a data latch circuit and each data latch circuit is configured to store a bit of fuse programming data to indicate whether an associated one of the fuses is to be blown, and wherein loading the shift register comprises serially transferring bits of fuse programming data present at a data input and to be stored in the data latch circuits through the plurality of stages;

(b) initializing a fuse pointer, formed by bits stored in the pointer latch circuits, to select a fuse;

(c) blowing the fuse selected by the fuse pointer if the bit of fuse programming data stored in the associated data latch circuit indicates the fuse is to be blown;

(d) advancing the pointer to select a subsequent fuse; and (e) repeating steps (c)–(d) until each of the fuses to be blown, as indicated by the respective bit of the fuse programming data, have been blown.

22. The method of claim 21, wherein initializing the fuse pointer comprises:

storing a bit of a first logic level in each of the pointer latch circuits; and storing a bit of a second logic level in one of the pointer latch circuits.

23. The method of claim 21, wherein advancing the pointer comprises providing a reset path between a node of a pointer latch circuit and ground.

24. The method of claim 23, wherein providing a reset path comprises:

switching a first transistor receiving, as input, a logic level stored in a first pointer latch circuit; and switching a second transistor receiving, as input, a logic level stored in a second pointer latch circuit.

25. A shift register circuit, comprising:

a data input;

a plurality of stages, each comprising a data latch circuit for storing a bit of data;

a pointer latch circuit for storing a bit of pointer information;

transfer circuitry for serially transferring bits of data presented at the data input and to be stored in the data latch circuits through the pointer latch circuits and data latch circuits of the plurality of stages during a first mode of operation; and pointer advance circuitry for serially transferring one or more bits of pointer information forming a pointer through the plurality of stages during a second mode of operation without disturbing bits of data stored in the data latch circuits.

* * * * *